United States Patent [19]
Harada

[11] Patent Number: 6,087,685
[45] Date of Patent: Jul. 11, 2000

[54] SOLID-STATE IMAGING DEVICE

[75] Inventor: Koichi Harada, Kanagawa, Japan

[73] Assignee: Sony Corporation, Tokyo, Japan

[21] Appl. No.: 08/988,693

[22] Filed: Dec. 11, 1997

[30] Foreign Application Priority Data

Dec. 12, 1996 [JP] Japan .................................. 8-332347
Dec. 12, 1996 [JP] Japan .................................. 8-332352

[51] Int. Cl.[7] ........................ H01L 27/148; H01L 29/768
[52] U.S. Cl. ........................ 257/232; 257/233; 257/240; 257/243
[58] Field of Search .................................. 257/232, 233, 257/240, 243, 248

[56] References Cited

U.S. PATENT DOCUMENTS 5,280,186 1/1994 Lu .............................. 257/232
5,351,081 9/1994 Matsui et al. ............................ 348/249
5,723,884 3/1998 Kim ........................................ 257/232

Primary Examiner—Ngân V. Ngô
Attorney, Agent, or Firm—Hill & Simpson

[57] ABSTRACT

A solid-state imaging device includes a plurality of sensor portions, and a vertical shift register corresponding to each of a series of sensor portions. A transfer electrode of the vertical shift register is formed of a first electrode and a second electrode which are repeatedly provided corresponding to the respective series of sensor portions and also formed continuously between the sensor portions adjacent to each other in the vertical direction. A signal charge is read out from each of the sensor portions through a portion below a read gate portion of the first electrode between sensor portions located in the vertical direction.

5 Claims, 12 Drawing Sheets

SOLID-STATE IMAGING DEVICE

BACKGROUND OF THE INVENTION

1. Field of the Invention

The present invention relates to a solid-state imaging device and particularly to a charge coupled device (CCD) type solid-state imaging device.

2. Description of the Related Art

FIGS. 1 and 2 are diagrams showing an arrangement of a CCD solid-state imaging device and particularly showing an arrangement of a unit cell portion thereof.

As shown in FIG. 1, a CCD solid-state imaging device 1 has a plurality of sensor portions 2 arranged in a matrix fashion, and vertical shift registers 3 having a CCD structure provided on each side of a series of the sensor portions.

A transfer electrode 4 of the vertical shift register 3 has a first electrode 5 formed of a first-layer polysilicon and a second electrode 6 formed of a second-layer polysilicon, and the first electrodes 5 and the second electrodes 6 of the transfer electrodes are repeatedly arranged along the vertical direction so as to correspond to the respective sensor portions 2. The first electrode 5 and the second electrode 6 are commonly formed with respect to each of the vertical shift registers 3.

A read gate portion 7 employing the second electrode 6, for example, as a gate electrode, i.e., a read gate portion for reading a signal charge from the sensor portion 2 to the vertical shift register 3 is formed between the sensor portion 2 and the vertical shift register 3 corresponding thereto. A channel stopper region 8 is formed between the sensor portion 2 and the vertical shift register 3 formed on the opposite side of the vertical shift register 3 adjacent to the read gate portion 7.

FIG. 2 is a cross-sectional view showing a semiconductor structure of the CCD solid-state imaging device 1 shown in FIG. 1 and cut along a line A—A shown in FIG. 1. In this semiconductor structure, a second conductive type, e.g., p-type first well region 12 is formed on a first conductive type, e.g., n-type silicone substrate 11, and the sensor portion 2, an n-type transfer region 13 forming the vertical shift register 3 and the p-type channel stopper region 8 are formed in the first p-type well region 12.

The sensor portion 2 is formed as a so-called hole accumulated sensor having the p-type well region 12, an n-type impurity region 15 formed therein, a charge accumulation layer formed on a surface of the n-type impurity region 15 and a p-type high-density impurity region 16 serving as a hole accumulation layer in this example.

A p⁻ region 17 is formed in the read gate portion 7. A second p-type well region 18 is formed under the n-type transfer region 13.

The transfer electrode 4 made of polysilicon is formed through a gate insulating film 19 on the n-type transfer region 13 and the p⁻ region 17 of the read gate portion 7. An interlayer insulating film 20 is formed on an entire surface including a surface of the transfer electrode 4, and further a light shielding film 21 made of, for example, Al or the like is formed on an entire surface other than at an opening portion 22 provided immediately over the sensor portion 2.

In the CCD type solid-state imaging device 1, when a voltage is applied to the second electrode 6 of the transfer electrode 4, signal charges accumulated in the sensor portion 2 by photoelectric conversion are read out therefrom through the read gate portion 7 to the vertical shift register 3 as shown by an arrow a in FIG. 1. Further, the transferred signal charges are shifted in the vertical direction in the vertical shift register 3 by a driving operation of the transfer electrode 4.

In order to suppress smear caused in the CCD solid-state imaging device by rays of light which are made incident from an opening-portion side edge portion of the light shielding film 21 and repeatedly reflected between the light shielding film 21 and the silicon substrate 11 to consequently reach the vertical shift register 3, a portion 21a (hereinafter referred to as a projection portion) from an edge portion, on the side of the sensor portion 2 of the transfer electrode 4, of the light shielding film 21 to an opening portion 22 thereof is formed so as to be long.

However, since in the CCD solid-state imaging device 1 shown in FIGS. 1 and 2 a width of the sensor portion 2 is set to an interval between the transfer electrodes 4, 4 adjacent to each other in the traverse direction of the sensor portion 2, miniaturization of a unit cell prevents the projection portion 21a of the light shielding film 21 from being made longer because a proper area of the opening portion 22 must be kept.

It can be considered to set the width of the transfer electrode 4 located immediately over the vertical shift register 3 narrower in order to project the projection portion 21a of the light shielding film 21 further. However, since the read gate portion 8 is provided between the sensor portion 2 and the vertical shift register 3 as described above, when the sensor portion 2 is not formed by using self-alignment relative to the transfer electrode 4, a barrier is generated between the sensor portion 2 and the read gate portion 8 and consequently prevents the signal charge from being read out from the sensor portion 2.

On the other hand, when the sensor portion 2 is formed by using the self-alignment with respect to the transfer electrode 4, the area of the read gate portion 8 becomes narrower, which makes the signal charges from the sensor portion 2 overflow in the vertical shift register when the signal charge is not read out and hence causes a so-called blooming.

Therefore, it is difficult to reduce smear further in the CCD solid-state imaging device 1. Smear tends to increase as the unit cell is more miniaturized.

Moreover, since the width of the sensor portion 2 is set equal to an interval between the transfer electrodes 4 adjacent to each other across the sensor portion 2 in the CCD solid-state imaging device 1, further miniaturization of the unit cell deteriorates a read characteristic and increases blooming. As a result, it is difficult to set the width of the read gate portion 7 narrower, which leads to deterioration of a device characteristic and increase of smear.

Therefore, it is difficult to form the opening portion 22 of the light shielding film 21, and the unit cell cannot be miniaturized beyond about 5 $\mu m^2$.

Moreover, when the signal charges in the sensor portion 2 are read out therefrom to a portion of the corresponding vertical shift register 3 under a predetermined transfer electrode, it is necessary to provide a channel stopper region 8 which should be minimum. In the arrangement shown in FIG. 2, in order to prevent the signal charges from leaking from the adjacent sensor portion 2 in the vertical direction, it is necessary to provide the read gate portion 7 at the second electrode 6 formed of the second-layer polysilicon.

Also, in this case, in order to suppress smear caused in the CCD solid-state imaging device by rays of light which are made incident from an opening-portion side edge portion of the light shielding film 21 and repeatedly reflected between the light shielding film 21 and the silicon substrate 11 to consequently reach the vertical shift register 3, a portion 21a (hereinafter referred to as a projection portion) from an edge portion on the side of the sensor portion 2 of the transfer electrode 4 of the light shielding film 21 to an opening portion 22 thereof is formed so as to be long.

Therefore, even if the unit cell is further miniaturized, it is impossible to reduce the width of the channel stopper region 8, which consequently leads to deterioration of the device characteristics and an increase of the smear.

SUMMARY OF THE INVENTION

In view of such aspects, it is an object of the present invention to provide a solid-state imaging device and a method of reading a signal charge in a solid-state imaging device which can reduce smear and can provide an excellent image characteristic.

It is another object of the present invention to provide a solid-state imaging device in which a unit cell can be miniaturized and which allows frame reading and field reading.

It is further another object of the present invention to provide a solid-state imaging device which allows miniaturization of a unit cell and allows a read gate to be provided at an optional transfer electrode.

According to a first aspect of the present invention, a solid-state imaging device includes a large number of sensor portions provided in a matrix fashion in the longitudinal and lateral directions of a base for carrying out photoelectric conversion, a vertical register portion linearly formed in a portion having a predetermined lateral-direction interval between the sensor portion along the longitudinal direction of the sensor portions for transferring a signal charge from the sensor portion in its linear direction, and a transfer electrode continuously formed on a portion of the base and immediately above the vertical register portion and immediately above the portion having a predetermined interval between the sensor portion in the longitudinal direction. The transfer electrodes comprise a first electrode and a second electrode with respect to one of a series of lateral-direction sensor portions. The first electrode is formed at a position immediately above the portion having a predetermined longitudinal-direction interval between the sensor portions so as to have a first inter-pixel portion having a width substantially equal to the predetermined longitudinal-direction interval. The second electrode is formed on the first inter-pixel portion so as to have a second inter-pixel portion having a width narrower than the width of the first inter-pixel portion. Further, a first channel stopper portion continuously formed along the longitudinal direction is provided between the series of sensor portions arranged in the longitudinal direction and one of the vertical shift register portions provided on both sides thereof and a second channel stopper portion formed continuously along the longitudinal direction and discontinuously at a position immediately below the first inter-pixel portion is provided between the series and the other thereof.

According to a second aspect of the present invention, a solid-state imaging device includes a plurality of sensor portions, and a vertical shift register corresponding to each of a series of sensor portions. A transfer electrode of the vertical shift register is formed of first electrodes and second electrodes which are repeatedly provided corresponding to the respective series of sensor portions and also formed continuously between the sensor portions adjacent to each other in the vertical direction and a signal charge is read out from each of the sensor portions through one portion below a read gate portion of the first electrode between sensor portions located in vertical direction.

According to a third aspect of the present invention, a solid-state imaging device includes a plurality of sensor portions each having a first conductive type charge accumulation layer on a surface of a second conductive type region formed in a first conductive type semiconductor layer, and a vertical shift register corresponding to each of series of sensor portions. The second conductive region of the sensor portion is formed so as to be located away from a transfer electrode of the vertical shift register by a predetermined distance except a portion in contact with a read gate portion, and the first conductive type charge accumulation layer is formed at a surface of the second conductive type region by self-alignment.

DETAILED DESCRIPTION OF THE PREFERRED EMBODIMENTS

A solid-state imaging device according to a first embodiment of the present invention will hereinafter be described with reference to FIGS. 3 to 5.

Figure 3:
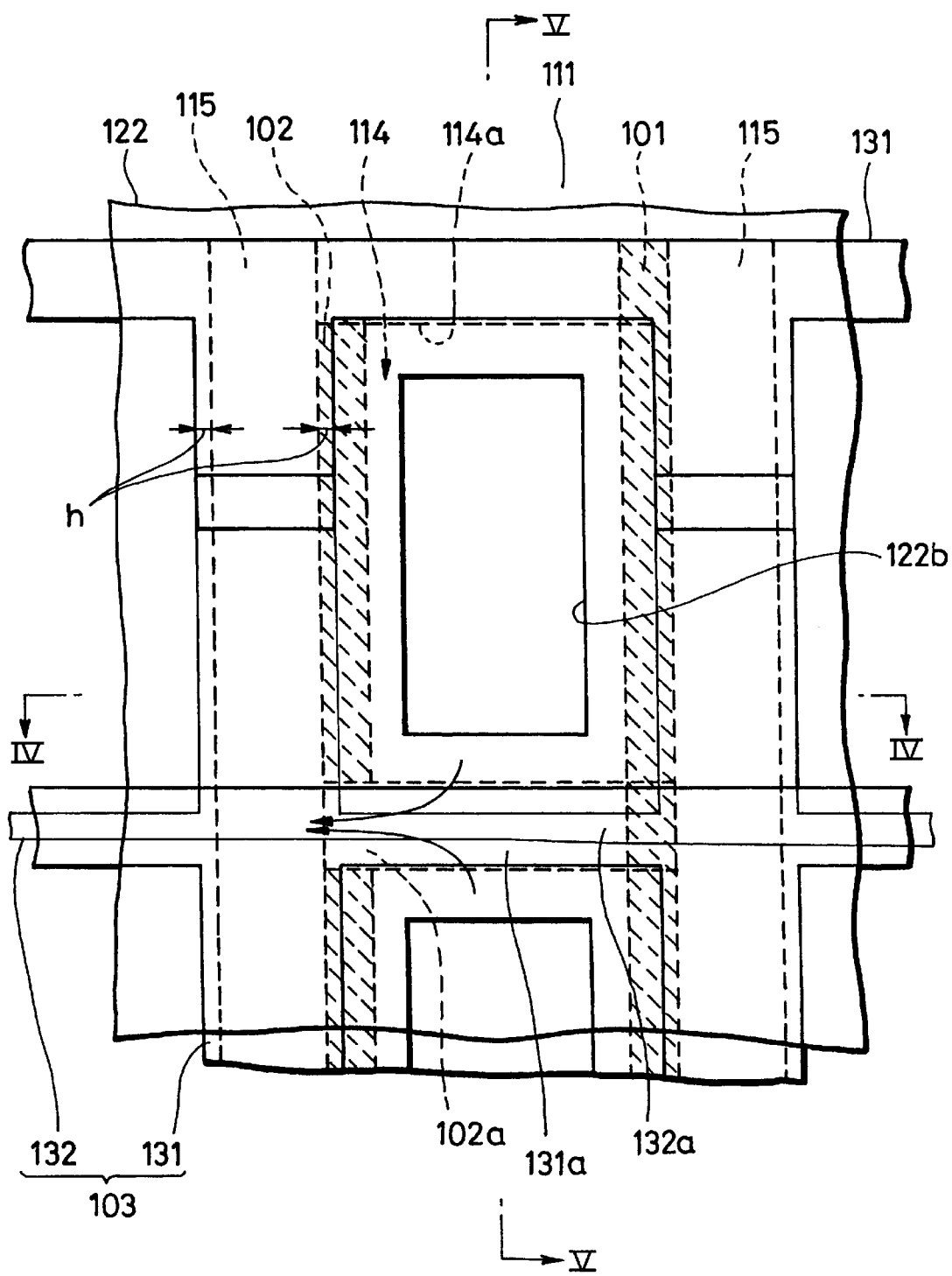
FIG. 3 is a plan view showing a schematic arrangement of a main part of a solid-state imaging device according to a first embodiment of the present invention.

FIG. 3 is a plan view showing a schematic arrangement of a main part of the solid-state imaging device according to the first embodiment of the present invention and particularly showing a unit cell which is a feature of the present invention. FIG. 4 is a cross-sectional view, cut along a ling X—X in FIG. 3, of the solid-state imaging device shown in FIG. 3. FIG. 5 is a cross-sectional view, cut along a ling Y—Y in FIG. 3, of the solid-state imaging device shown in FIG. 3.

Figure 4:
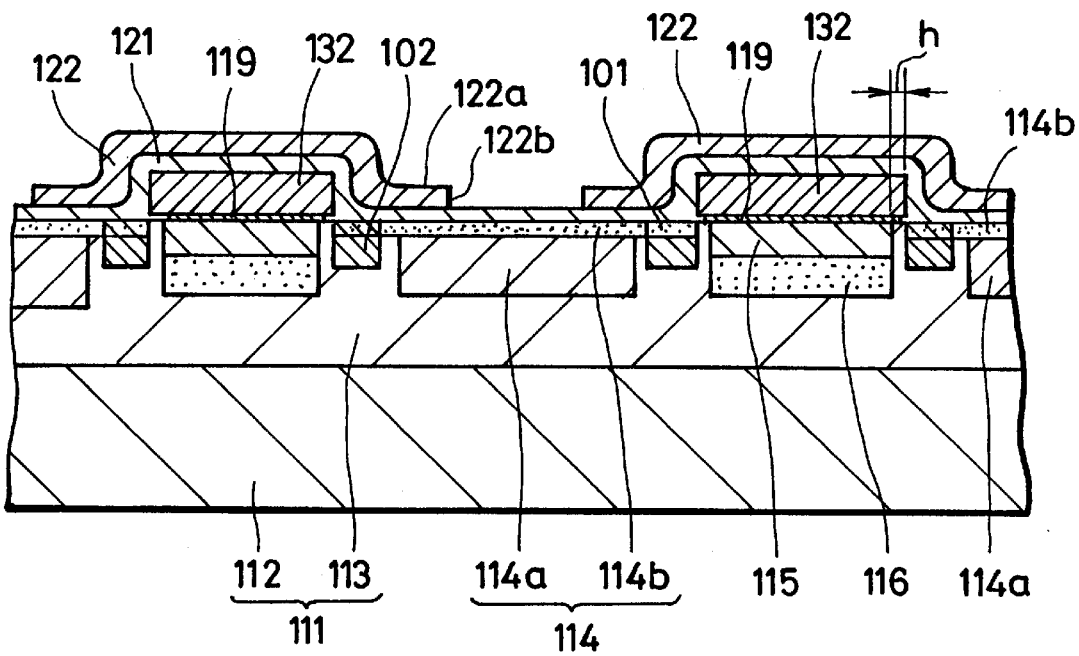
FIG. 4 is a cross-sectional view of the solid-state imaging device according to the first embodiment cut along a line X—X.
Figure 5:
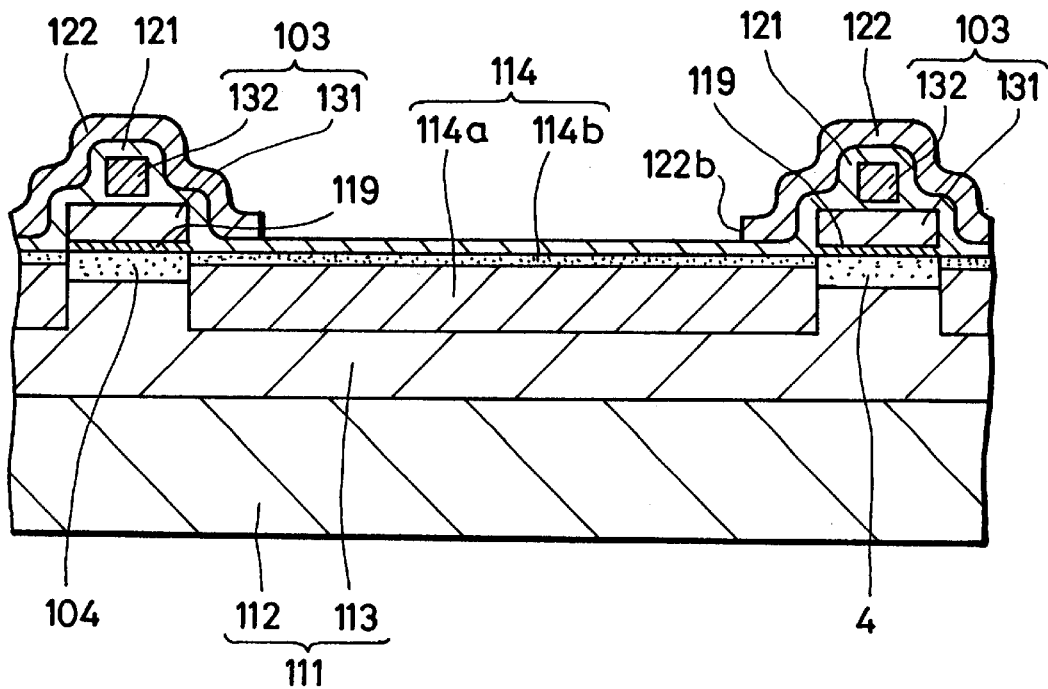
FIG. 5 is a cross-sectional view of the solid-state imaging device according to the first embodiment cut along a line Y—Y.

As shown in FIGS. 3 to 5, the CCD solid-state imaging device according to the first embodiment has a base 111 formed of an n-type Si substrate 112 and a p-type impurity layer 113 formed thereon. On the base 111, similarly to the solid-state imaging device shown in FIG. 1, a sensor portion 114 for photoelectrically converting incident light to accumulate it therein and a vertical register portion 115 for transferring the signal charge accumulated in the sensor portion 114 are formed.

Specifically, a large number of substantially rectangular-shaped sensor portions 114 each of which are formed of an n-type impurity layer 114a and a p-type impurity layer 114b formed on a surface side of the base 111 are provided in a matrix fashion in the longitudinal and lateral directions of the base 111 at a predetermined interval. Stripe vertical register portions 115 formed of n-type impurity layers are formed along the longitudinal direction of the sensor portion 114 between the sensor portions 114 adjacent to each other in the lateral direction at a predetermined interval, i.e, between series of the sensor portions 114 provided in the longitudinal direction (hereinafter referred to as a series of longitudinal-direction sensor portions 114). Further, a p-well portion 116 is formed immediately under the vertical register portion 115.

A first channel stopper portion 101 is continuously formed along the above longitudinal direction at one of the portions located between the series of the longitudinal-direction sensor portions 114 of the base 111 and the vertical register portions 115 located on both sides of the series of the sensor portions 114. A second channel stopper portion 102 which is a feature of the present invention is substantially continuously formed along the above longitudinal direction at the other of the portions located between the series of the longitudinal-direction sensor portions 114 and the vertical register portions 115 so as to be discontinuous at portions immediately under first inter-pixel portions 131a of a first electrode 131 described later on.

A transfer electrode 103 made of poly-Si is continuously provided on the base 111 immediately on the vertical register portion 115 and immediately on the portions located at a predetermined interval of the series of the sensor portions 114, i.e., immediately on the portions between the sensor portions 114 (pixels) adjacent to each other in the longitudinal direction of the sensor portions 114. Similarly to the arrangement shown in FIG. 1, a gate oxide film 119 is disposed between the transfer electrode 103 and the base 111.

The transfer electrode 103 has the first electrode 131 and a second electrode 132 with respect to each of a series of the sensor portions 114 in the lateral direction (hereinafter referred to as a series of lateral-direction sensor portions 114). Each of the first electrode 131 and the second electrode 132 is continuously formed in the lateral direction of the sensor portion 114, and the first electrode 131 and the second electrode 132 are alternately provided in the longitudinal direction of the sensor portion 114. The second electrode 132 is provided so as to overlap the adjacent first electrodes 131 at a substantially middle position along the longitudinal direction of the sensor portion 114 and immediately at a position between the pixels adjacent to each other in the longitudinal direction.

The first electrode 131 has a first inter-pixel portion 131a which is formed on a portion between the pixels in the longitudinal direction of the sensor portion 114 and has a width substantially equal to an interval between the pixels. The second electrode 132 has a second inter-pixel portion 132a which is formed on the first inter-pixel portion 131a and has a width narrower than the above width thereof. Each of the first electrode 131 and the second electrode 132 is formed so as to have a width which is a width of its portion immediately on the vertical register portion 115 and which is substantially equal to the width of the vertical register portion 115.

The second channel stopper portion 102 formed between the series of the longitudinal-direction sensor portions 114 and the vertical register portion 115 in the base 111 is substantially continuously formed in the longitudinal direction of the sensor portion 114 except at a portion (hereinafter referred to as a discontinuous portion) where it is discontinuous at a portion immediately below the above first inter-pixel portion 131a. A region of the base 111 which is located immediately below the first inter-pixel portion 131a and other than the first channel stopper portion 101 is formed as a p$^-$-type impurity region 104.

Figure 1:
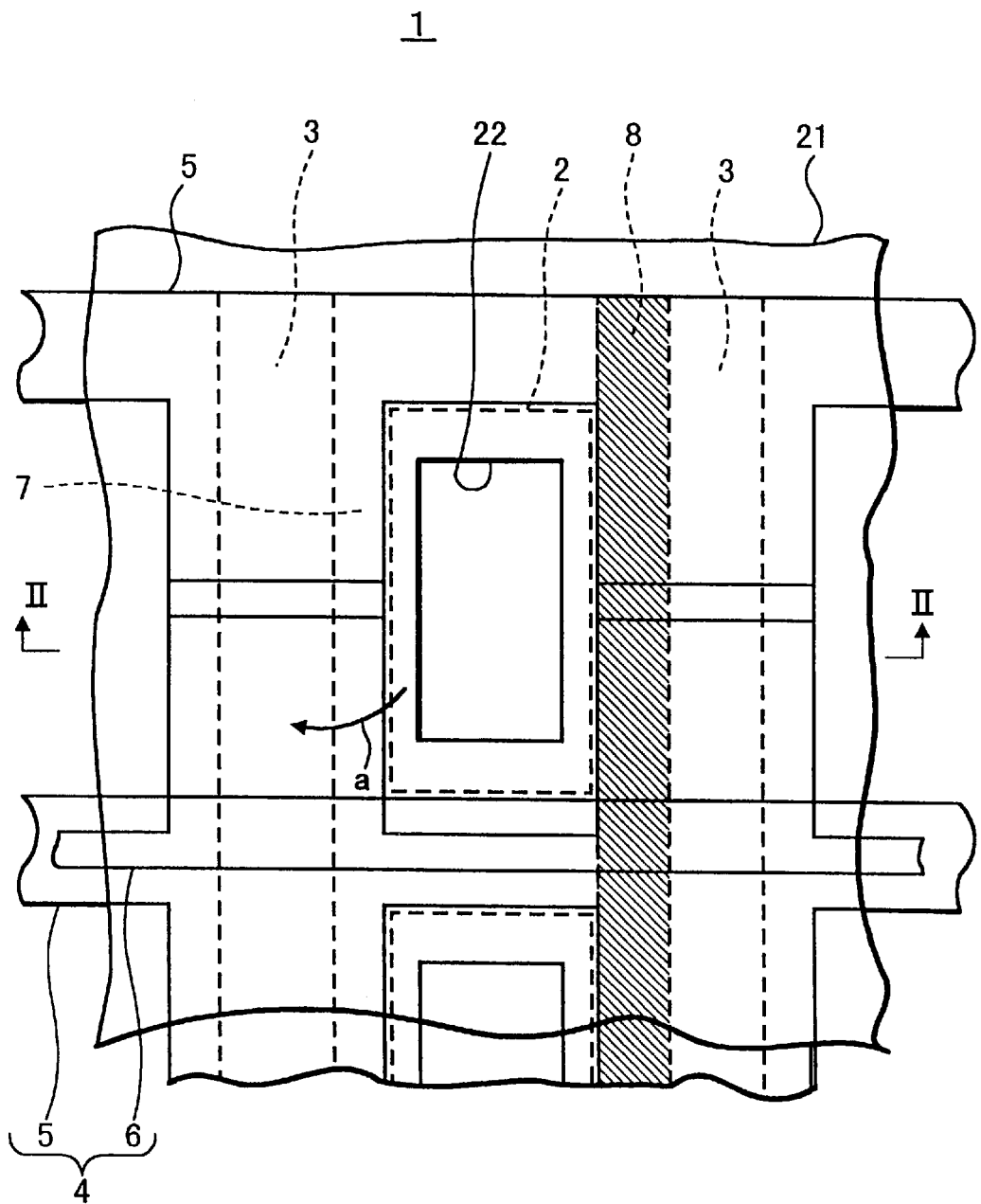
FIG. 1 is a diagram showing an arrangement of a solid-state imaging device.
Figure 2:
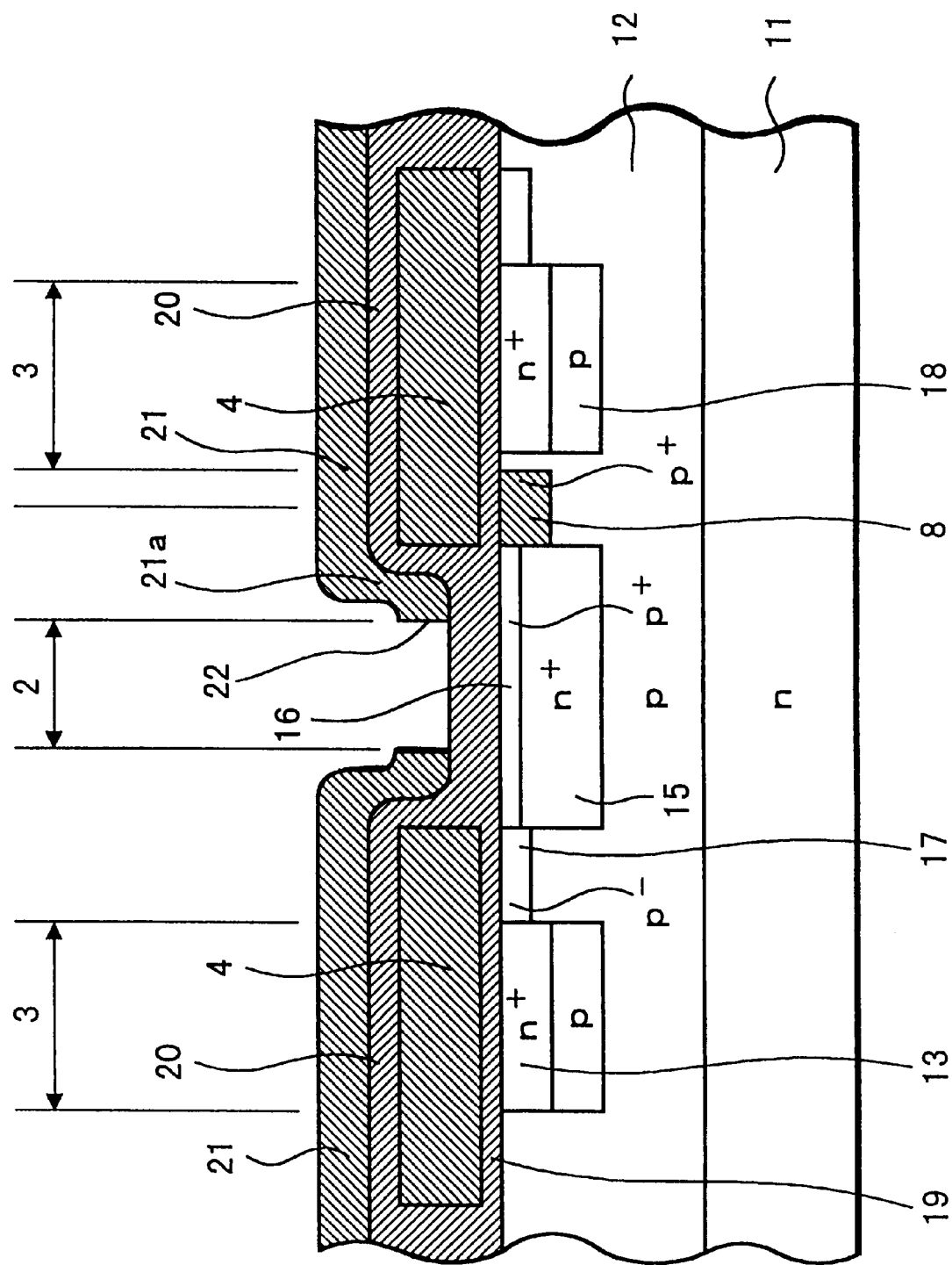
FIG. 2 is a cross-sectional view, cut along a line A—A in FIG. 1, of the solid-state imaging device shown in FIG. 1.

Moreover, similarly to the arrangement shown in FIG. 1, an interlayer insulating film 121 made of PSG is formed on the base 111 so as to cover the transfer electrode 103. A light shielding film 122 of Al and having an opening potion 122b immediately above the sensor portion 114 is formed on the interlayer insulating film 21.

When the CCD solid-state imaging device having the above arrangement is formed, a p-type well region 116 and the vertical register portion 115 are respectively formed in the base 111 by successively implanting p-type impurities and n-type impurities by ion implantation in a region of the base 111 where the vertical register portion 115 is to be formed, and the first channel stopper portion 101 and the second channel stopper portion 102 are formed by implanting p-type impurities in regions where the first channel stopper portion 101 and the second channel stopper portion 102 are to be formed, respectively. Immediately after the ion implantation processings, p$^-$-type impurities are ion-implanted in an entire surface of the base 111 to form a p$^-$-type impurity region 104.

Thereafter, the gate oxide film 119 is formed on the surface of the base 111 by thermal oxidation method, for example. Subsequently, a poly-Si film is formed by chemical vapor deposition (CVD), and the poly-Si film is subjected to the patterning by lithography and etching to thereby form the first electrode 131. Subsequently, an insulating film (not shown) is formed on a surface of the first electrode 131 by thermal oxidation method or the like, and then a poly-Si film is formed on the base 111 so as to cover the first electrode 131. Subsequently, the poly-Si film is subjected to the patterning by lithography or etching to thereby form the second electrode 132.

While the first channel stopper portion 101, the second channel stopper portion 102 and regions therebetween are covered by a mask continuously formed along the longitudinal direction, n-type impurities are ion-implanted in the base 111 to form an n-type impurity layer 114a of the sensor portion 114. Subsequently, p+-type impurities are implanted in an entire surface of the base 111 using the transfer electrode 103 for self-alignment, thereby the p+-type impurity layer 114b of the sensor portion 114 being formed. When the n-type impurities are ion-implanted, the impurities are implanted in the base 111 with using the first inter-pixel portion 131a of the first electrode 131 for self-alignment.

Thereafter, similarly to a method employed for forming the CCD solid-state imaging device shown in FIG. 1, the interlayer insulating film 121 and the light shielding film 102 are formed, thereby the CCD solid-state imaging device according to the first embodiment being obtained.

According to the CCD solid-state imaging device formed as described above, the first channel stopper portion 101 and the second channel stopper portion 102 are formed between the series of the longitudinal-direction sensor portions 114 and the vertical register portion 115 disposed on both sides thereof, and the p⁻-type impurity region 104 is formed immediately below the first inter-pixel portion 131a having the width set substantially equal to an interval between the pixels adjacent to each other in the longitudinal direction of the sensor portion 114. Therefore, as shown in arrows in FIG. 3, when a voltage is applied to the first electrode 131 of the transfer electrode 103, the signal charges in the sensor portion 114 can be passed through the p⁻-type impurity region 104 disposed immediately below the first inter-pixel portion 131a and the discontinuous region 102a of the second channel stopper portion 102 and hence read out to the vertical register portion 115.

At this time, when the voltage is applied to one of the first electrodes 131, it is possible to simultaneously read out the signal charges from the two sensor portions 114 adjacent to each other in the longitudinal direction across the first inter-pixel portion 131a.

Therefore, assuming that the first electrodes 131-1, 131-2, 131-3, 131-4, ... are provided in the transfer direction of the vertical register portion 115 and a voltage is alternately applied to the odd-numbered first electrodes 131 such as the first electrodes 131-1, 131-3, ... and the even-numbered first electrodes 131 such as the first electrodes 131-2, 131-4, ..., an interlaced reading operation can be carried out.

Since the signal charges in the sensor portion 114 are read out therefrom through the inter-pixel portion provided in the direction of the sensor portion 114 as described above, it becomes unnecessary to provide any read gate portion between the sensor portion 114 and the vertical register portion 115 and hence it is possible to reduce the width of the transfer electrode 103 disposed on the vertical register portion 115 up to the width of the vertical register portion 115.

Moreover, since the portion between the sensor portion 114 and the vertical register portion 115 is not employed for reading the signal charges, even if the sensor portion 114 is not formed with using the transfer electrodes 131, 132 for the self-alignment when the width of transfer electrode 103 provided immediately above the vertical register portion 115 is set narrower, a state can be avoided when the signal charges are prevented from being read out. Since the read gate portion is not provided, it is possible to prevent the blooming or the like from occurring. Reference letter h shown in FIGS. 3 and 4 depicts a masking accuracy.

According to the first embodiment of the present invention, since the transfer electrode 103 can be formed so as to have a narrow width at the position on the vertical register portion and the projection portion 122a of the light shielding portion 122 can be formed so as to be long, if dimensions such as a unit cell size, the width of the vertical register portion 115, a longitudinal-direction width of the sensor portion 114 and so on are set similar to those of the arrangement shown in FIG. 1, then it is possible to reduce the smear by 10 dB or larger and hence it is possible to obtain the CCD solid-state imaging device having an improved video characteristic.

As described above, since the solid-state imaging device according to the first embodiment of the present invention has the first channel stopper portion and the second channel stopper portion respectively formed between the series of longitudinal-direction sensor portions and the vertical register portions located on both the sides thereof, it is possible to form a signal-charge read path from sensor portion to the vertical register portion through the first inter-pixel portion and the discontinuous portion of the second channel stopper portion, and hence it is possible to form the transfer electrode at the position on the vertical register portion so that the transfer electrode should have a narrower width. Therefore, since the projection portion can be formed so as to be longer while the area of the opening portion of the light shielding film provided on the transfer electrode is kept, the smear can be reduced, which leads to the solid-state imaging device having the improved video characteristics.

According to the signal-charge reading method employed in the solid-state imaging device according to the present invention, since the voltage is applied to the first electrode and thereby the signal charges in the sensor portion are read out through the portion between the pixels in the longitudinal direction of the sensor portion, it is possible to reduce the width of the transfer electrode on the vertical register portion and consequently it is possible to form the longer projection portion of the light shielding film. Therefore, it is possible to reduce the smear and hence it is possible to form the solid-state imaging device which can improve the video characteristics.

A solid-state imaging device according to a second embodiment of the present invention will hereinafter be described with reference to the accompanying drawings.

Figure 6:
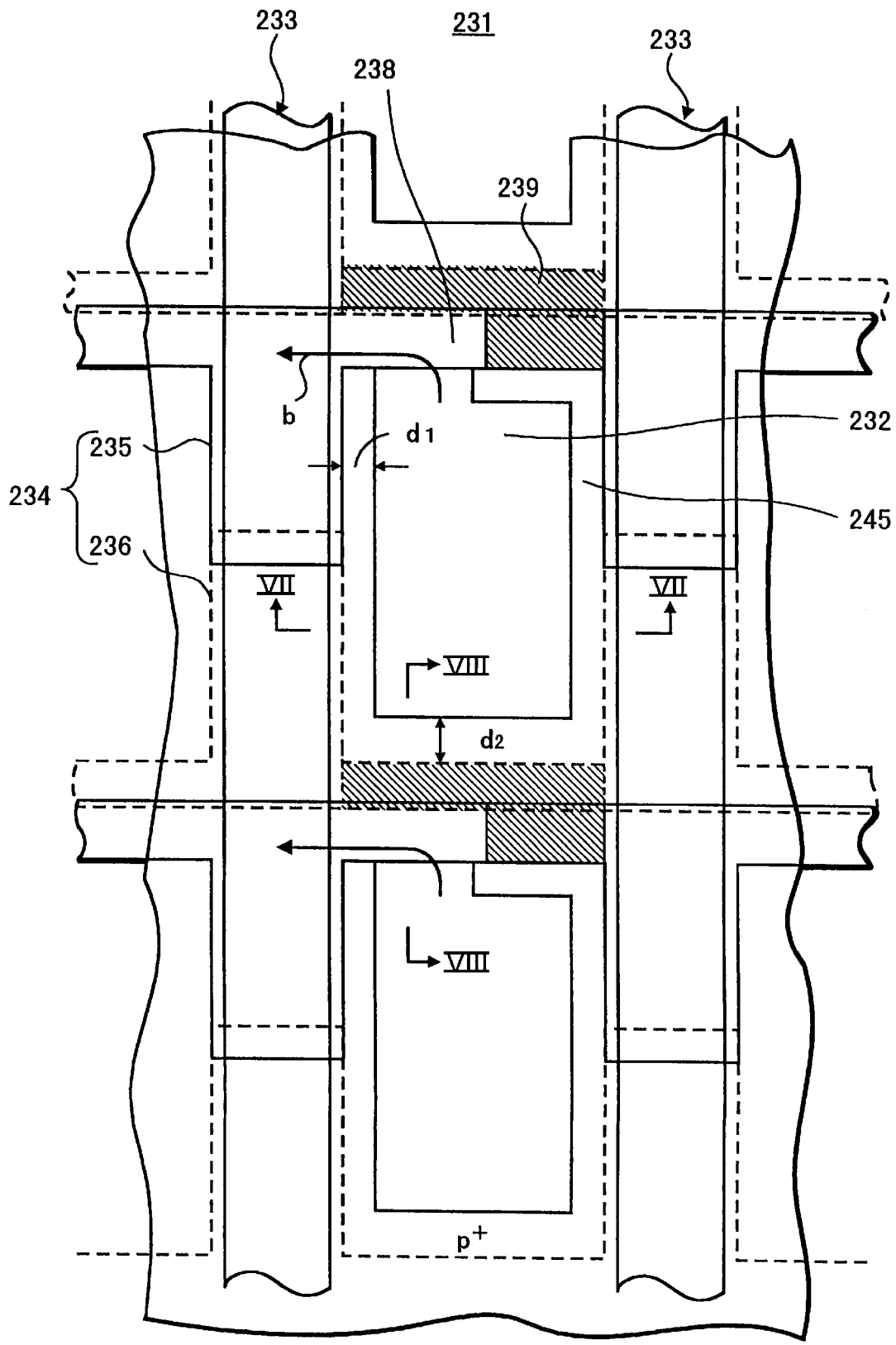
FIG. 6 is a plan view showing a schematic arrangement of a main part of a solid-state imaging device according to a second embodiment of the present invention.
Figure 7:
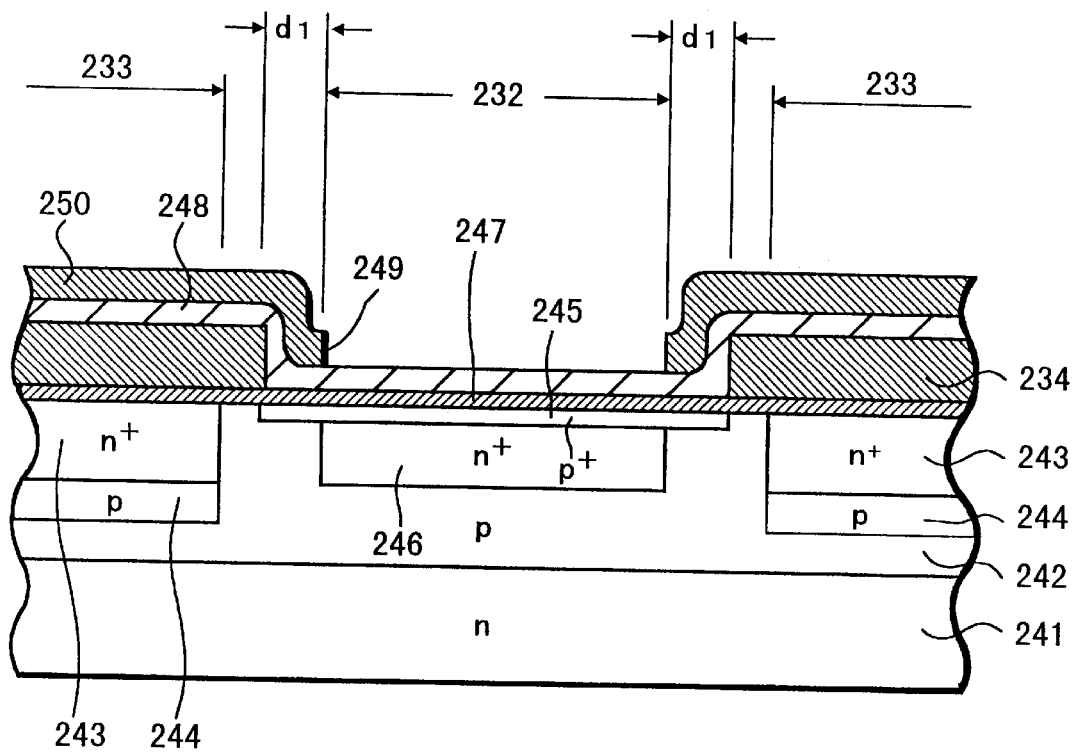
FIG. 7 is a cross-sectional view of the solid-state imaging device according to the second embodiment cut along a line B—B.
Figure 8:
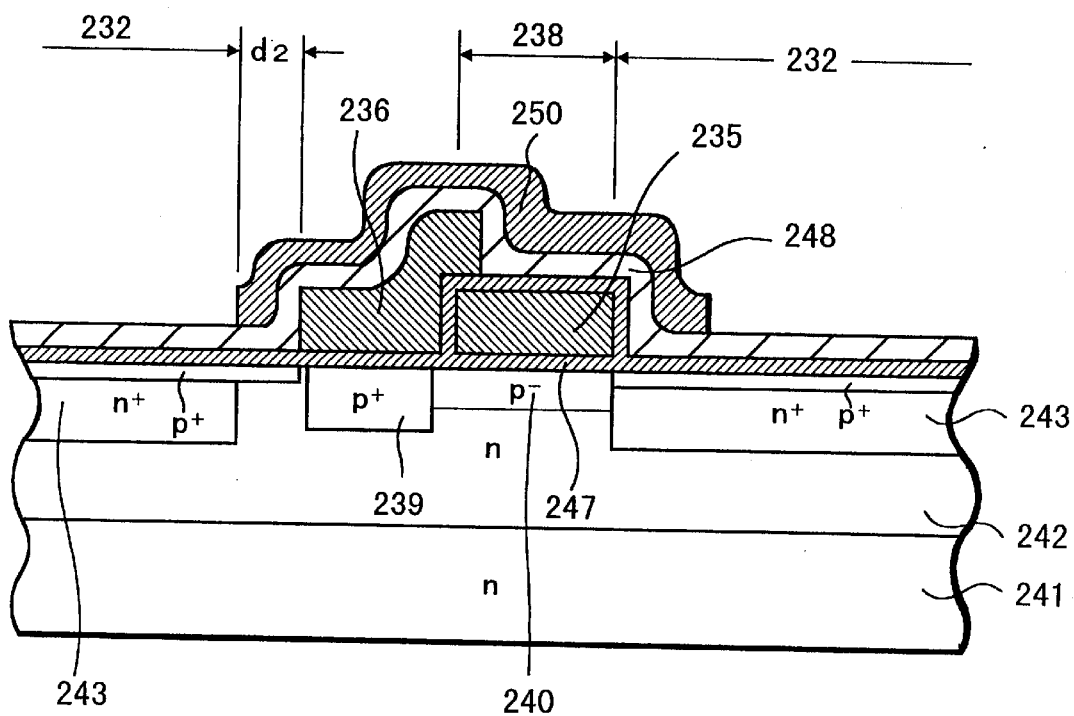
FIG. 8 is a cross-sectional view of the solid-state imaging device according to the second embodiment cut along a line C—C.

FIGS. 6 through 8 are diagrams showing a CCD solid-state imaging device according to the second embodiment and particularly showing its unit cell portion.

As shown in FIG. 6, a CCD solid-state imaging device 231 according to the second embodiment has a plurality of sensor portions 232 arranged in a matrix fashion and vertical shift registers 233 each of which has a CCD structure and is provided on one side of each series of the sensor portions 232. A transfer electrode 234 of the vertical shift register 233 has a first electrode 235 formed of a first-layer polysilicon, for example, and a second electrode 236 formed of a second-layer poly silicone. The first electrodes 235 and the second electrodes 236 are repeatedly arranged along the vertical direction so as to correspond to the respective sensor portions 232. The first electrode 235 and the second electrode 236 are formed so as to extend between the sensor portions 232 adjacent to each other in the vertical direction and so as to be common with respect to each of the vertical shift registers 233.

At this time, the first electrode 235 and the second electrode 236 are formed at the portion between the sensor portions 232 so as to be respectively provided at upper and lower half areas obtained by dividing the portion between the sensor portions 232 into two in the vertical direction.

Each of the sensor portions 232 is formed so that a part of its upper side edge in the vertical direction, i.e. its left-side upper side edge on the left side in FIG. 6 shifted toward the vertical shift register for reading the signal charge, should be adjacent to the first electrode 235 between the sensor portions 232. Other periphery edges, i.e., the right side upper side edge, both side edges opposed to the vertical shift registers 237 and its lower side edge should be offset from the transfer electrode 234 by predetermined distances $d_1$, $d_2$ and $d_1$.

Moreover, in the second embodiment, a channel stopper region 239 shown by hatchings in FIG. 6 is formed at the portion between the sensor portions 232 and below a right-half portion of the first electrode 235 (i.e. a portion other than the portion 238 serving as the read gate portion) and the second lectrode 236.

The channel stopper region 239 below the second electrode 236 may be omitted.

FIG. 7 is a cross-sectional view showing a semiconductor structure of the solid-state imaging device 231 cut along a line B—B in FIG. 6, and FIG. 8 is a cross-sectional view showing a semiconductor structure of the solid-state imaging device 231 cut along a line C—C in FIG. 6.

In this semiconductor structure, a second conductive type, e.g., p-type first well region 242, is formed on a first conductive type, e.g., n-type silicon semiconductor substrate 241. An n-type transfer region 243 forming the vertical shift register 233 is formed in the first p-type well region 242.

A second p-type well region 244 is formed immediately under the n-type transfer region 243.

The transfer electrode 234 formed of the first electrode 235 and the second electrode 236 each of which is made of polysilicon is formed on the n-type transfer region 243 through a gate insulating film 247.

A high-density p-type impurity region 245 serving as a charge accumulation layer forming a surface of the sensor portion 232, i.e., as a hole accumulation layer in this embodiment, is formed by ion implantation employing the transfer electrode 234 as a mask for self-alignment.

Moreover, an n-type impurity region 246 is formed by ion implantation employing a photoresist as a mask at a position below the p-type impurity region, i.e., the hole accumulation layer 245 in this embodiment, so as to be offset from the transfer electrode 234 by the distances $d_1$, $d_2$ at the respective sides along the vertical and horizontal directions. Thus, the sensor portion 232 called a so-called hole accumulated sensor formed of the first p-type well region 242, the n-type impurity region 246 and the hole accumulation layer 245 is formed.

The p-type channel stopper region 239 is formed in the first p-type well region 242 at a region between the sensor portions 232 and below the portion ranging from a part of the first electrode 235 to the second electrode 236. Moreover, a low-density p-type region 240 is formed at the region forming the read gate portion.

An interlayer insulating film 248 is formed on an entire surface including a surface of the transfer electrode 234. Further, a light shielding film 250 made of Al or the like is formed on an entire surface excluding an opening portion 249 corresponding to a position above the sensor portion 242.

The hole accumulation layer 245 at the surface of the sensor portion 232 extended in a region between the sensor portion 232 and the transfer electrodes 234 located away from each other by the distances $d_1$, $d_2$ serves as the channel stopper region.

The vertical shift register 233 is driven by a four-phase drive pulse in this embodiment. The signal charges read out from the sensor portion 232 to the vertical shift register 233 are transferred in the vertical shift register 233 in the vertical direction by driving the transfer electrode 234.

According to the CCD solid-state imaging device 231 having the above arrangement, when a high-level voltage is applied to the first electrode 235 of the transfer electrode 234, photoelectric conversion is carried out in the sensor portion 232 and consequently the signal charges therein are, as shown by an arrow b in FIG. 6, read out therefrom to the one corresponding vertical shift register 233 through the read gate portion 238 formed by the first electrode 235 between the sensor portion 232 and the one, i.e., upper-side sensor portion 232.

At this time, since the channel stopper region 239 is provided at a portion below the right half side of the first electrode 235 between the sensor portions 232, the signal charges in the sensor portion 232 are prevented from being read out therefrom to the vertical shift register 233 located on the opposite side.

Moreover, since the offset regions each having a width $d_1$ are provided between the sensor portion 232 and the both-side vertical shift registers 233, the signal charges in the sensor portion 232 are prevented from leaking therefrom to the vertical shift registers through the offset portions.

Since the channel stopper region 239 is provided at a portion below the second electrode 236 between the sensor portions 232 adjacent to each other in the vertical direction, the signal charges are more reliably prevented from leaking between the sensor portions 232 adjacent to each other in the vertical direction. Specifically, each of the sensor portions 232 is reliably separated from other sensor portions 232 so as to be independent thereof.

Therefore, since the read gate portion provided between the sensor portion and the vertical shift register in the arrangement shown in FIG. 1 is not required in this embodiment, it is possible to downsize the unit cell to that extent. Simultaneously, a length of the projection portion of the light shielding film 250 can be sufficient, which leads to reduction of the smear.

If a positional relationship between the opening portion of the sensor portion 232 and the vertical shift register 233 is set similar to that of the arrangement shown in FIG. 1, then it is possible to increase the length of the projection portion, which is projected toward the sensor portion, of the light shielding film 250 to an extent that the read gate portion provided in the arrangement shown in FIG. 1 is omitted, which leads to further reduction of the smear.

Moreover, since the opening portion of the sensor portion 232 can be enlarged to an extent that the read gate portion provided in the arrangement shown in FIG. 1 is omitted, it is possible to increase the sensitivity.

Since the signal charges in each of the sensor portions 232 are independently read out therefrom through the read gate portion 238 of the first electrode 235 between the sensor portion 232 and the other sensor portion 232, it is possible to carry out both of the frame reading operation and the field reading operation.

Specifically, in the frame reading operation, the signal charges in the sensor portions in odd-numbered lines (for first field) are read out, and then the signal charges in the sensor portions in the even-numbered lines (for second field) are read out.

In the field reading operation, after the signal charges in each of the sensor portions are read out therefrom to the vertical shift register 233, the signal charges of an amount of two pixels adjacent to each other in the vertical direction are mixed in the vertical shift register 233 and then read out as the signal charges in the first field. The signal charges in each of the sensor portions are read out therefrom to the vertical shift register 233, and then the signal charges of an amount of two pixels adjacent to each other on the opposite side of the pixel, which is used in the above first field reading operation, in the vertical direction are mixed in the vertical shift register 233 and then read out as the signal charges in the second field.

Figure 10:
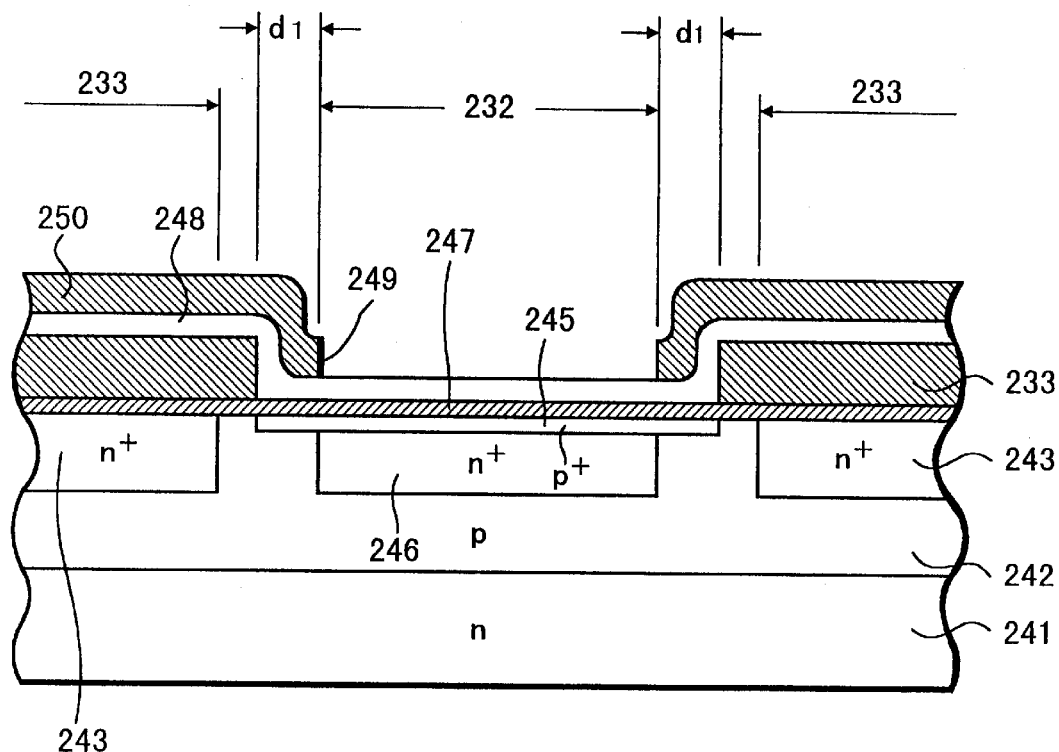
FIG. 10 is a cross-sectional view of the solid-state imaging device according to the third embodiment cut along a line D—D.
Figure 11:
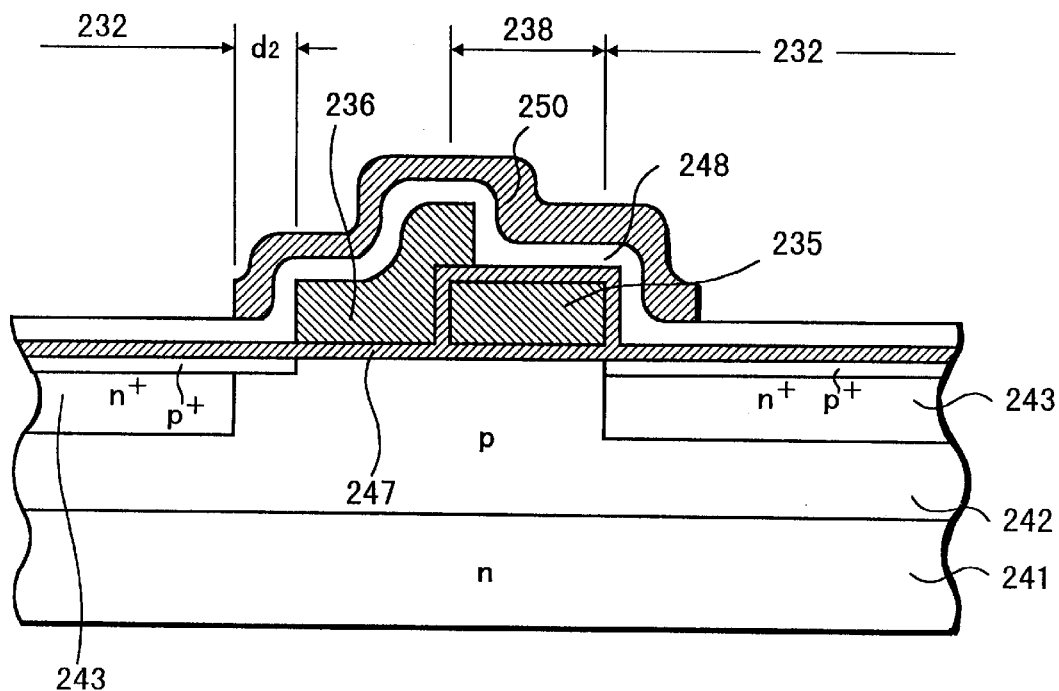
FIG. 11 is a cross-sectional view of the solid-state imaging device according to the third embodiment cut along a line E—E.

A solid-state imaging device according to a third embodiment of the present invention will hereinafter be described with reference to FIGS. 9 to 11.

A solid-state imaging device 52 according to the third embodiment has an arrangement similar to that shown in FIG. 6 except that the channel stopper region 239 provided in the arrangement shown in FIG. 6 is omitted. In FIGS. 9 to 11, like parts and portions corresponding to those shown in FIGS. 6 to 8 are marked with the same reference numerals and hence need not to be described in detail.

The sensor portion 232 has a rectangular shape whose upper side edge has a projected portion at its left half. The projected left half portion of the upper side edge is adjacent to the first electrode 235 of the sensor portion 232, and the other periphery portion, i.e., the right half portion of the upper side edge, both side edges opposed to the vertical shift registers 233 and the lower side edge are offset from the transfer electrode 234 by predetermined distances $d_1$, $d_2$, $d_1$, respectively.

Figure 9:
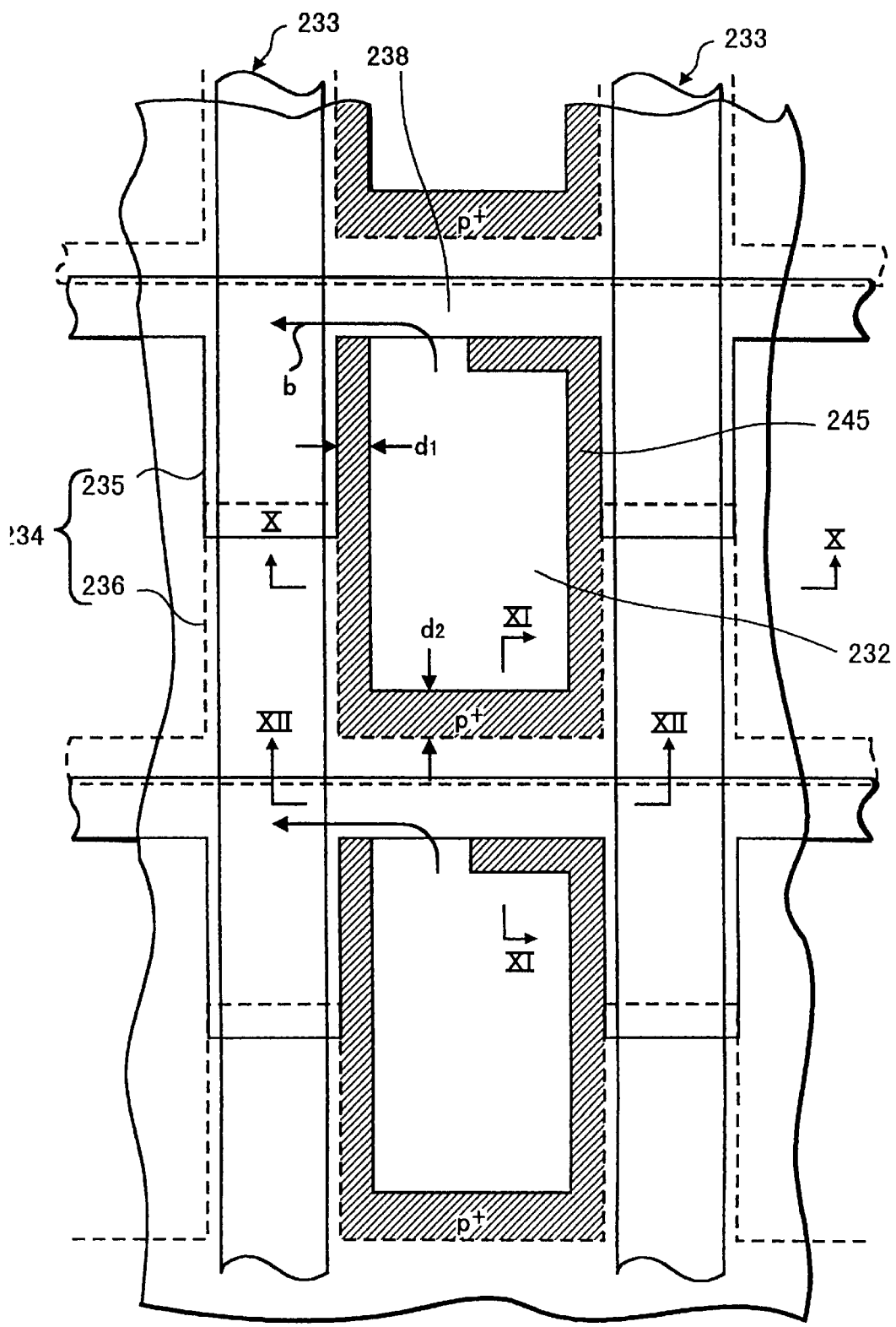
FIG. 9 is a plan view showing a schematic arrangement of a main part of a solid-state imaging device according to a third embodiment of the present invention.

In this offset region, as shown by hatchings in FIG. 9, a hole accumulation layer 245 of the extended sensor portion 232 serves as a channel stopper region.

In this arrangement, the hole accumulation layer 245 serving as both the offset region and the channel stopper region permits the sensor portion 32 to be separated from electrodes at the whole periphery thereof except the read gate portion 238 between the sensor portions 232.

Therefore, when a high-level voltage is applied to the first electrode 235 of the transfer electrode 234, as shown by an arrow b in FIG. 9, the signal charges accumulated in the sensor portion 232 through photoelectric conversion are read out therefrom through the read gate portion 238 formed by the first electrode 235 between the sensor portion 232 and one sensor portion located adjacent thereto at the upper side to one corresponding vertical shift register 233.

Figure 12:
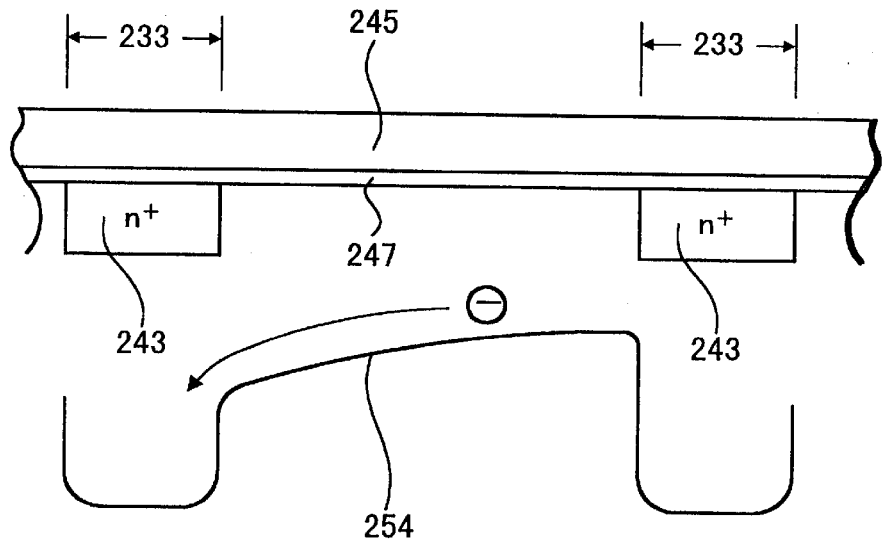
FIG. 12 is a diagram showing a potential on a line F—F shown in FIG. 9.

At this time, since, as shown in FIG. 12 which is a diagram showing potentials on a line F—F along the first electrode 235 between the sensor portion 232, a channel at the right-half region is made narrow by the hole accumulation layer 245 serving also as the channel stopper region, a potential 254 is increased at this side and hence a potential inclination in which the potential 254 becomes deeper in the direction from the right-side vertical shift register 233 toward the left-side vertical shift register 235 for reading out the charges.

Therefore, the signal charges read out from the sensor portion 232 are prevented from being erroneously read out by the vertical shift register 233 on the opposite side (right side).

As a result, the solid-state imaging device having the arrangement shown in FIG. 9 also achieves an effect similar to that achieved by the solid-state imaging device having the arrangement shown in FIG. 6.

Simultaneously, since the solid-state imaging device according to the third embodiment does not have the channel stopper region 239 provided in the arrangement shown in FIG. 6, it is possible to simplify the arrangement to that extent, and hence it is possible to reduce the manufacturing processes to that extent.

Figure 13:
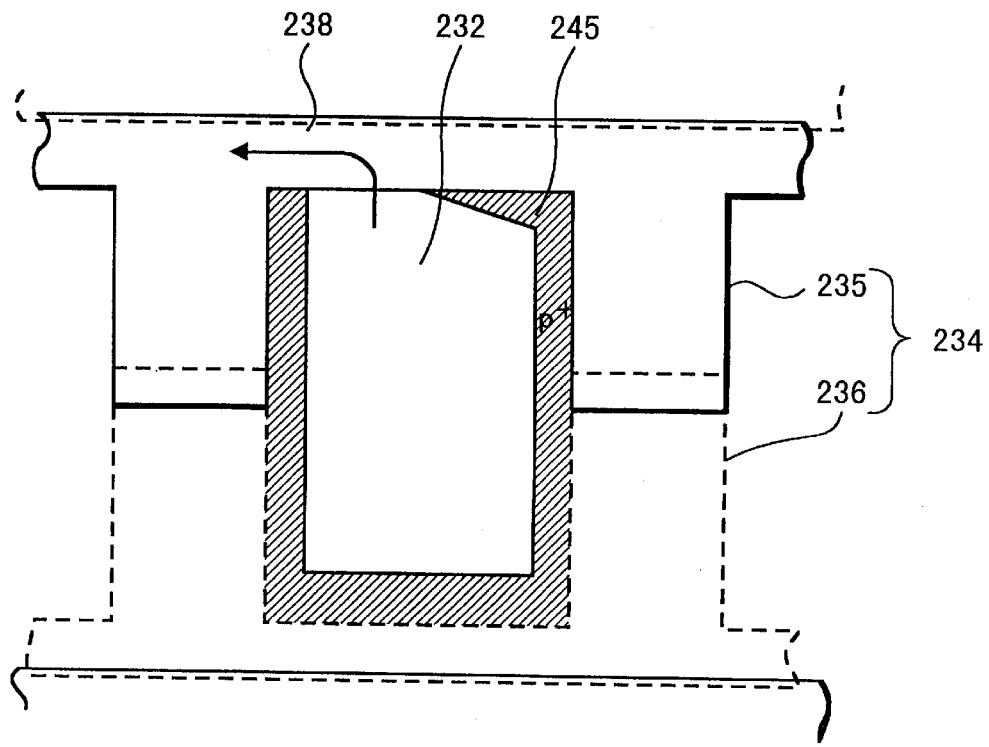
FIG. 13 is a plan view showing a schematic arrangement of a main part of a solid-state imaging device according to a fourth embodiment of the present invention.

While in the third embodiment the upper side edge of the sensor portion 232 is stepwise-shaped, the present invention is not limited thereto. As shown in FIG. 13, the upper side edge of the sensor portion 232 may be shaped so as to be inclined diagonally from its portion in contact with the read gate portion 238 in the direction to the right and rear side. In this case, the same effect can be achieved similarly to the solid-state imaging device according to the third embodiment having the arrangement shown in FIG. 9.

According to the solid-state imaging device of the second and third embodiments of the present invention, since the read gate portion between the sensor portion and the vertical shift register is not provided and the signal charges are read out from the sensor portion through the portion between the sensor portions to the vertical shift register, it is possible to miniaturize the unit cell further. If the length of the portion, projected toward the sensor portion, of the light shielding film is increased to an extent that the read gate portion is not provided, then the smear can be reduced further.

If on the other hand the opening portion of the sensor portion is enlarged to an extent that the read gate portion is not provided, it is possible to improve the sensitivity more.

Since the signal charges in each of the sensor portions are independently read out therefrom through a portion between the sensor portion and one of the sensor portions adjacent thereto to the vertical shift register, it is possible to carry out both of the frame reading operation and the field reading operation.

If the charge accumulation layer forming the sensor portion and provided on a surface thereof also serves as the channel stopper region between the sensor portion and the vertical shift register, then it is possible to simplify the arrangement of the solid-state imaging device and also it is possible to reduce the manufacturing processes.

If an edge side of the sensor portion which is located on the side of the portion between the sensor portion and one of the sensor portions adjacent thereto is located away from the first electrode except for the read gate portion and the charge accumulation layer provided on the surface of the sensor portion and serving also as the channel stopper region formed at the periphery of the sensor portion except for the read gate portion, the narrow channel effect brought by provision of the charge accumulation layer prevents the signal charges from being erroneously read from the sensor portion to the vertical shift register on the opposite side of the vertical shift register to which the signal charges are to be read out therefrom, and permits the signal charges to be reliably read out to the corresponding vertical shift register.

A solid-state imaging device according to a fifth embodiment of the present invention will be described with reference to FIGS. 14 to 16.

Figure 14:
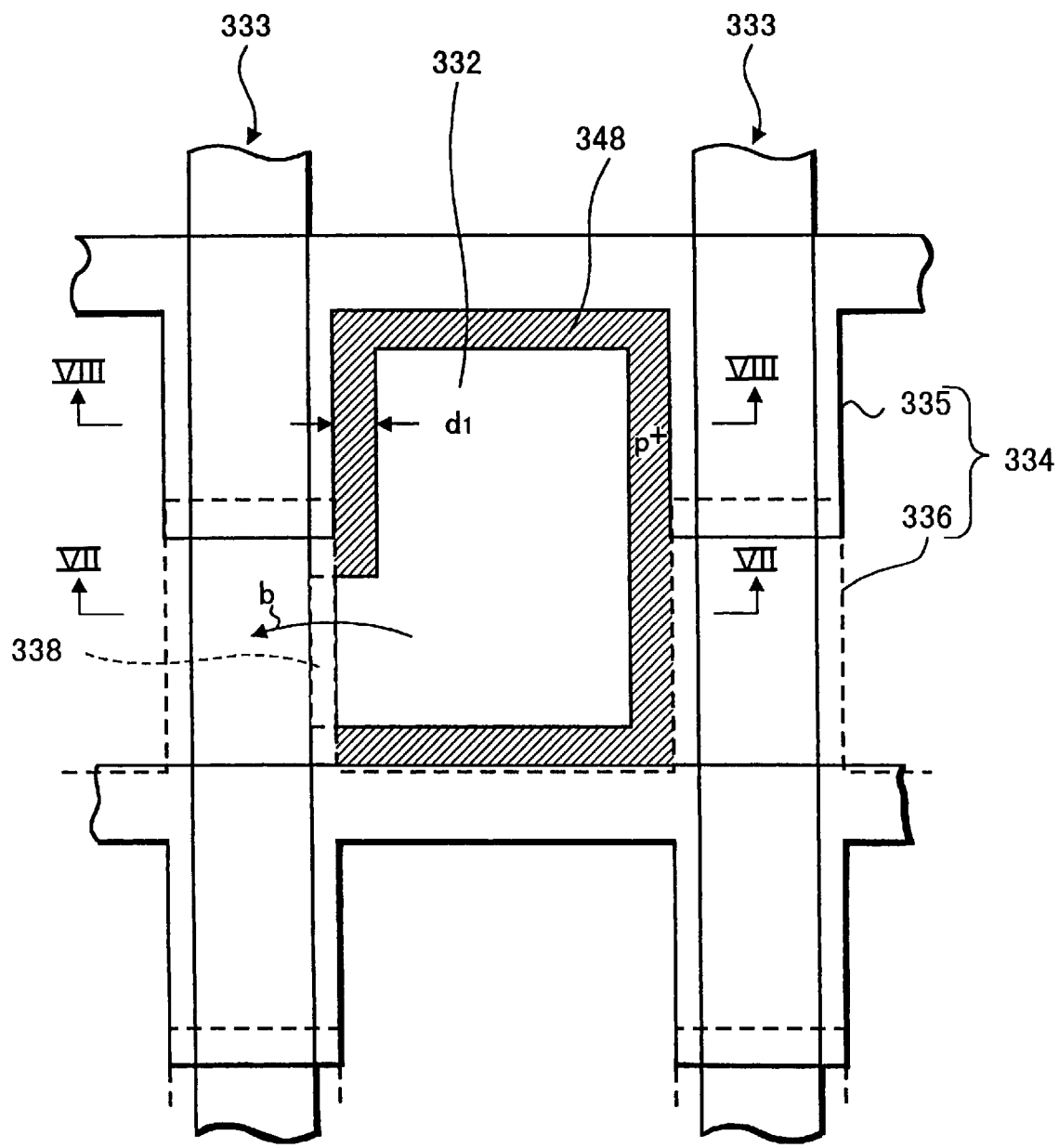
FIG. 14 is a plan view showing a schematic arrangement of a main part of a solid-state imaging device according to a fifth embodiment of the present invention.

As shown in FIG. 14, a CCD solid-state imaging device 331 according to the fifth embodiment has a plurality of sensor portions 332 arranged in a matrix fashion and vertical shift registers 333 each of which has a CCD structure and is provided on one side of each of series of the sensor portions 332. A transfer electrode 334 of the vertical shift register 333 has a first electrode 335 formed of a first-layer polysilicon, for example, and a second electrode 336 formed of a second-layer polysilicon. The first electrodes 335 and the second electrodes 336 are repeatedly arranged along the vertical direction so as to correspond to the respective sensor portiones 332. The first electrode 335 and the second electrode 336 are formed so as to be extended between the sensor portions 332 adjacent to each other in the vertical direction and so as to be common with respect to each of the vertical shift registers 333.

As will be described later on, the sensor portion 332 is formed as a so-called hole accumulated sensor formed of a first p-type well region 342, an n-type impurity region 350 and a charge accumulation layer, i.e., hole accumulation layer 348 on its surface. The sensor portion 332 is formed so as to have substantially the same area as that of an n-type impurity area 350.

In this embodiment, a read gate portion 338 employing a part of the second electrode 336 of the transfer electrode 334 as a read gate electrode is formed between the sensor portion 332 and the vertical shift register 333. The sensor portion 332 is formed so that a part of the substantial sensor portion 332 should be in contact with the read gate portion 338 and that the entire parts except the portion in contact with the read gate portion 338, is offset from the transfer electrode 334 by a predetermined distance $d_1$.

A hole accumulation layer 348 provided at a surface of the sensor portion 332 is formed on an entire surface of a region surrounded by the transfer electrode 334 including the offset region (i.e., a separation region between the sensor portion 332 and the transfer electrode 334). The hole accumulation layer 348 formed in the offset region shown by hatchings in FIG. 14 serves also as a channel stopper region.

Figure 15:
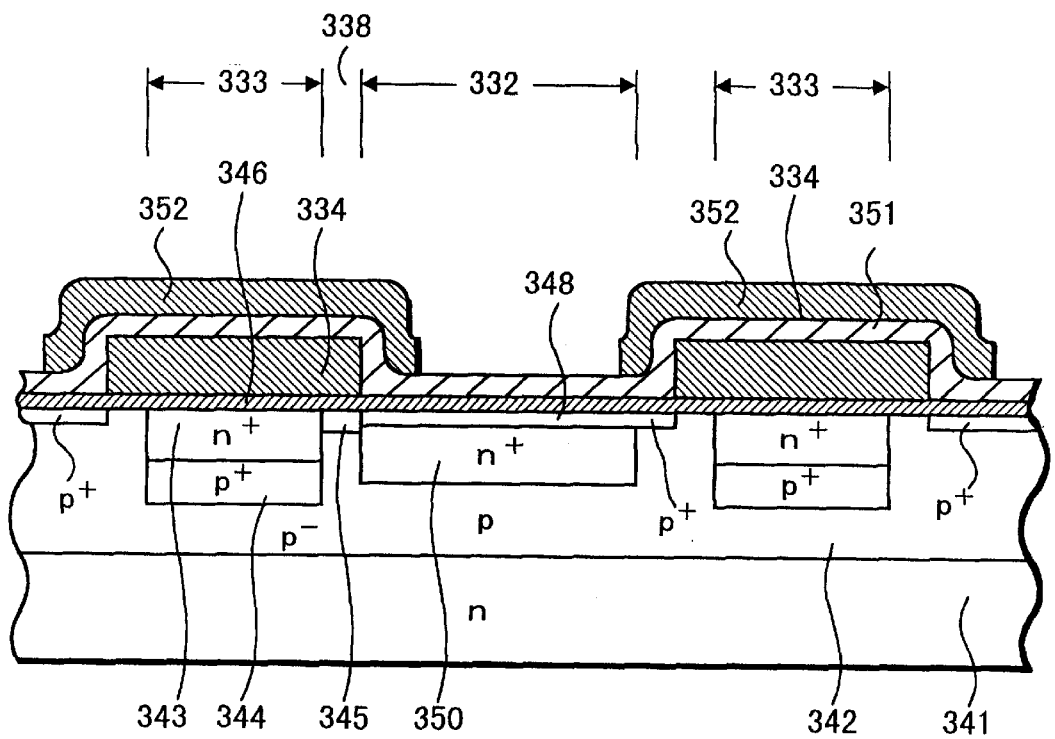
FIG. 15 is a cross-sectional view of the solid-state imaging device according to the fifth embodiment cut along a line B—B.
Figure 16:
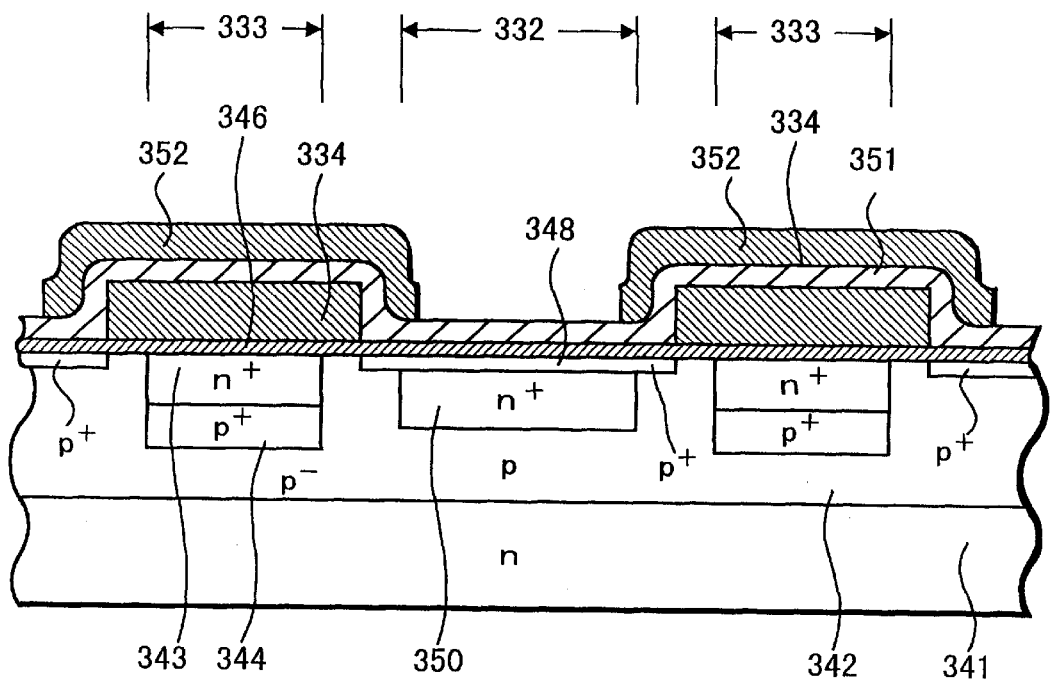
FIG. 16 is a cross-sectional view of the solid-state imaging device according to the fifth embodiment cut along a line C—C.

FIG. 15 is a cross-sectional view showing a semiconductor structure of the solid-state imaging device 331 cut along a line B—B in FIG. 14, and FIG. 16 is a cross-sectional view showing a semiconductor structure of the solid-state imaging device 331 cut along a line C—C in FIG. 14.

In this semiconductor structure, a 'second conductive type, e.g., p-type first well region 342 is formed on a first conductive type, e.g., n-type silicon semiconductor substrate 341. An n-type transfer region 343 forming the vertical shift register 333 is formed in the first p-type well region 342. A second p-type well region 344 is formed immediately under the n-type transfer region 343. A low-density p-type semiconductor region forming the read gate portion 338 is provided. The transfer electrode 334 formed of the first electrode 335 and the second electrode 336 each of which is made of polysilicon is formed on the n-type transfer region 343 and the p-type semiconductor region 345 through a gate insulating film 346.

A high-density p-type impurity region 348 serving as a charge accumulation layer forming a surface of the sensor portion 332, i.e. as a hole accumulation layer in this embodiment, is formed by ion implantation employing the transfer electrode 334 as a mask for self-alignment. Moreover, an n-type impurity region 246 is formed by ion implantation employing a photoresist as a mask at a position below the p-type impurity region, i.e. the hole accumulation layer 348, so as to be offset from the transfer electrode 334 by the distance $d_1$. Thus, the sensor portion 332 called a so-called hole accumulated sensor formed of the first p-type well region 342, the n-type impurity region 350 and the hole accumulation layer 345 is formed.

An interlayer insulating film 351 is formed on an entire surface including a surface of the transfer electrode 334. Further, a light shielding film 350 made of Al or the like is formed on an entire surface excluding an opening portion 352 corresponding to a position above the sensor portion 332.

The vertical shift register 333 is driven by a four-phase drive pulse in this embodiment. The signal charges read out from the sensor portion 332 to the vertical shift register 333 are transferred in the vertical shift register 333 in the vertical direction by driving the transfer electrode 334.

According to the CCD solid-state imaging device 331 having the above arrangement, when a high-level voltage is applied to the second electrode 336 of the transfer electrode 334, photoelectric conversion is carried out in the sensor portion 332 and consequently the signal charges therein are, as shown by an arrow b in FIG. 14, read out therefrom to the one corresponding vertical shift register 333 through the read gate portion 338 formed by the second electrode 336.

Moreover, since the sensor portion 332 is offset from the transfer electrode 334 by the distance $d_1$ at a portion except for the read gate portion 338 and hole accumulation layer 348 of the sensor portion 332, it serves as the channel stopper region and, the signal charges in the sensor portion 232 are prevented from leaking therefrom to the vertical shift registers on the opposite side through the offset portions.

As described above, since the channel stopper region is omitted and the hole accumulation layer 348 of the sensor portion 332 serves also as the channel stopper region, it is possible to omit the ion implantation process for forming the channel stopper region.

Since the channel stopper region is not provided, it is possible to increase the length of the projection portion of the Al light shielding film to that extent, which leads to further reduction of the smear.

Moreover, since the sensor portion 332 is offset from the transfer electrode and the hole accumulation layer 348 serves also as the channel stopper region, the channel stopper region is not provided independently, which leads to miniaturization of a unit cell size.

A solid-state imaging device according to a sixth embodiment of the present invention will be described with reference to FIG. 17.

A solid-state imaging device 355 according to the six embodiment has the same arrangement as that of the fifth embodiment shown in FIG. 14 except a read gate portion 338 is changed, i.e., the read gate portion 388 is formed by employing a part of the first electrode 335 formed of a first-layer polysilicon. In FIG. 17, like parts and portions corresponding to those shown in FIG. 14 are marked with the same reference numerals and hence need not be described in detail.

A sensor portion 332 is offset from a transfer electrode 334 by a predetermined distance $d_1$ except at its portion adjacent to the read gate portion 338 formed at the first electrode 325. A hole accumulation layer 348 is formed at an entire surface of the sensor portion 332 and in a region surrounded by the transfer electrode 334, and a portion thereof corresponding to the offset region serves also as a channel stopper region.

Figure 17:
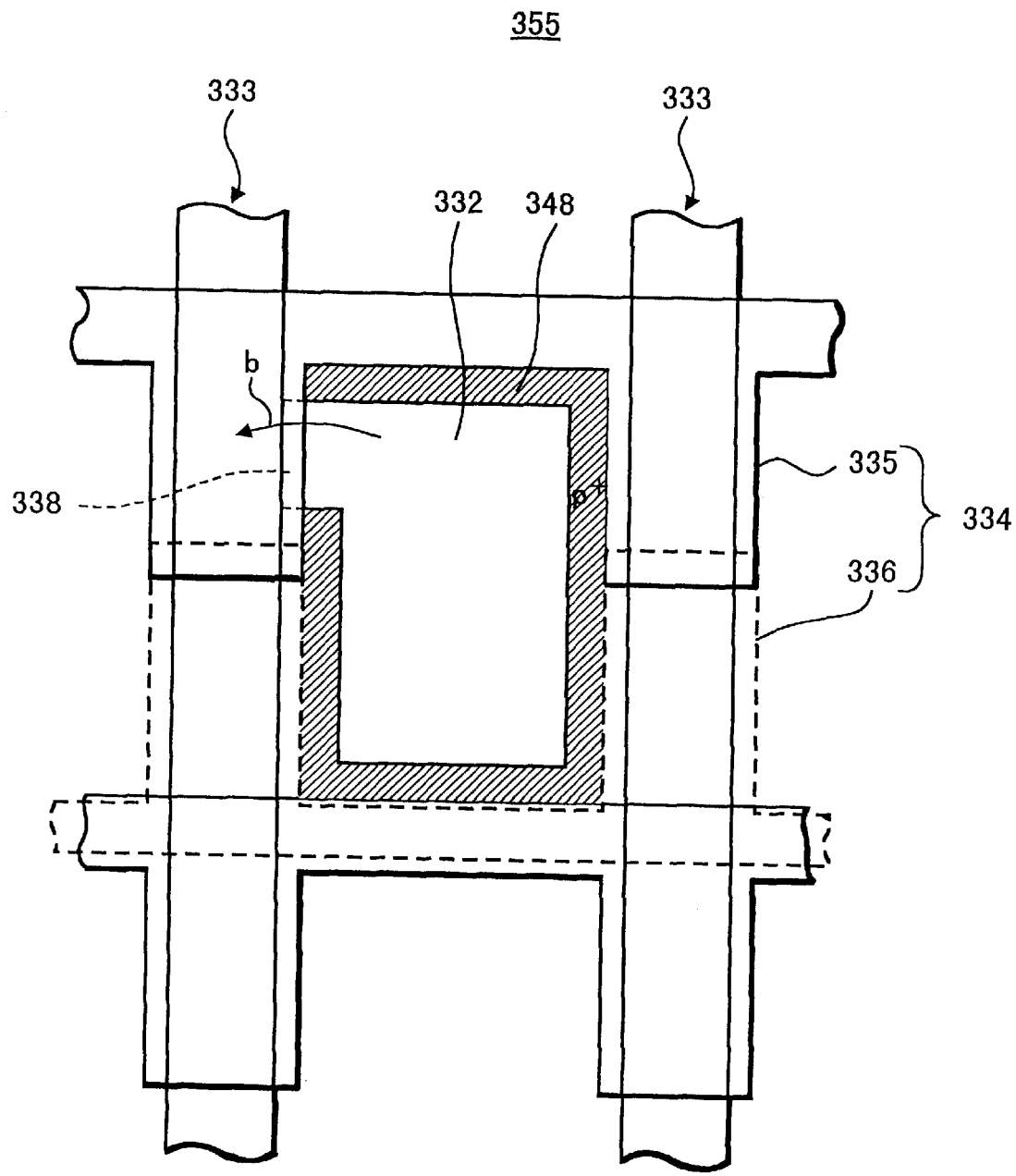
FIG. 17 is a plan view showing a schematic arrangement of a main part of a solid-state imaging device according to a sixth embodiment of the present invention.

Also, in this arrangement, when a high-level voltage is applied to the first electrode 335 of the transfer electrode 334, the signal charges accumulated in the sensor portion 332 by photoelectric conversion are, as shown by an arrow b in FIG. 17, read out therefrom through the read gate portion 338 formed by the first electrode to the corresponding vertical shift register 333.

In particular, while, if the read gate portion is formed by the first electrode, the signal charges from the sensor portions adjacent to each other in the vertical direction may be partially erroneously mixed and read out, the solid-state imaging device according to the six embodiment is free from such problem.

The solid-state imaging device according to the sixth embodiment achieves the same effect as that achieved by the solid-state imaging device according to the fifth embodiment shown in FIG. 14.

According to the solid-state imaging devices of the fifth and sixth embodiments, since the independent channel stopper region is not provided, it is possible to further miniaturize the unit cell.

The length of the projection portion, which is projected toward the sensor portion, of the light shielding film is increased to an extent that the channel stopper region is not provided, which leads to further reduction of the smear. If on the other hand the opening portion of the sensor portion is widened to an extent that the channel stopper region is not provided, which leads to the improved sensitivity. Moreover, the omission of the independent channel stopper region allows reduction of the manufacturing processes.

While the read gate portion can be formed only by the second electrode made of the second-layer polysilicon of the transfer electrode in the arrangement shown in FIG. 1, the present invention enables the read gate portion to be formed by an optional electrode, e.g., the first electrode, the second electrode or the like of the transfer electrode, which increases the degree of freedom in the design of the solid-state imaging device.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A solid-state imaging device, comprising:
   a plurality of sensor portions arranged in vertical and horizontal directions;
   a vertical shift register running vertically corresponding to a series of sensor portions in the vertical direction along side the vertical shift register;
   a plurality of transfer electrodes each formed of first and second electrodes, each transfer electrode corresponding to a respective one of said series of vertically arranged sensor portions; and
   the first electrodes being arranged to provide a read gate portion at a space located between sensor portions in the vertical direction for reading out a signal charge from the respective sensor portions to the vertical shift register, and a channel stopper region between the sensor portions and adjacent the read gate portion.

2. The imaging device according to claim 1 wherein a light shield is provided over the transfer electrodes and wherein an opening is provided in the light shield beneath which the sensor portions are formed, each sensor portion having an insulating layer which is followed by a gate insulating film, a charge accumulation layer, and an impurity region.

3. The imaging device according to claim 2 wherein the impurity region is formed in a first well region and the first well region is provided on a substrate.

4. The imaging device according to claim 2 wherein a lateral extent of the impurity region corresponds with a width of the opening in the light shield at the sensor portion.

5. The imaging device according to claim 1 wherein the first electrode lies above a low density region forming the read gate portion and the second electrode is provided along side the first electrode above a channel stopper region.

* * * * *